United States Patent [19]

Scott et al.

[11] 4,374,700
[45] Feb. 22, 1983

[54] METHOD OF MANUFACTURING SILICIDE CONTACTS FOR CMOS DEVICES

[75] Inventors: David B. Scott, Plano; Roderick D. Davies, Richardson; Yee-Chaung See, Plano, all of Tex.

[73] Assignee: Texas Instruments Incorporated, Dallas, Tex.

[21] Appl. No.: 268,201

[22] Filed: May 29, 1981

[51] Int. Cl.³ .................. H01L 21/308; H01L 21/24; H01L 21/283
[52] U.S. Cl. ..................................... 156/656; 29/571; 29/591; 156/643; 156/657; 357/59; 357/67
[58] Field of Search ............... 156/657, 656, 643; 29/591, 571; 357/42, 59, 67

[56] References Cited

U.S. PATENT DOCUMENTS 4,033,797 7/1977 Dill et al. .............................. 357/42
4,319,395 3/1982 Lund et al. ........................... 156/662
4,332,839 6/1982 Levinstein et al. ................... 156/656

FOREIGN PATENT DOCUMENTS 21400 1/1981 European Pat. Off. ............... 29/571
2930630 3/1980 Fed. Rep. of Germany ........ 357/42

OTHER PUBLICATIONS

Rideout, "Method . . . Lines", IBM Technical Disclosure Bull., vol. 23, No. 6, (11/80), pp. 2563-2566.
De La Moneda, "Self-Aligned . . . Contacts", IBM Technical Discl. Bull., vol. 24, No. 7a, (12/81), pp. 3454-3457.
Tsang, "Forming . . . Barrier", IBM Technical Disclosure Bull., vol. 19, No. 9, (2/77), pp. 3383-3385.
Jambotkar, "Realization . . . Structure", IBM Technical Discl. Bull., vol. 24, No. 7b, (12/81), pp. 3847-3851.

Primary Examiner—Jerome W. Massie
Attorney, Agent, or Firm—Robert Groover, III; Melvin Sharp; James T. Comfort

[57] ABSTRACT

In the manufacture of a CMOS device, oxide is etched away from polysilicon gate-level interconnects, and from source or drain regions of either conductivity type to which the polysilicon gate-level interconnect is desired to be connected. A metal is then deposited, and silicide is formed to connect the gate-level interconnect to the respective source and drain regions. To ensure continuity of the silicide connection, the gate oxide beneath the gate level interconnect is slightly undercut by a wet etching process, additional polysilicon is deposited conformally overall, and the additional polysilicon is anistropically etched so that it is removed from all areas except those within the undercut region beneath the gate-level interconnect thus a continuous surface of silicon, from which a continuous layer of silicide is then grown, exists between the polysilicon gate-level interconnect and the respective source and drain regions. Thus, self-aligned contacts are created, and no unwanted pn junctions are created.

10 Claims, 9 Drawing Figures

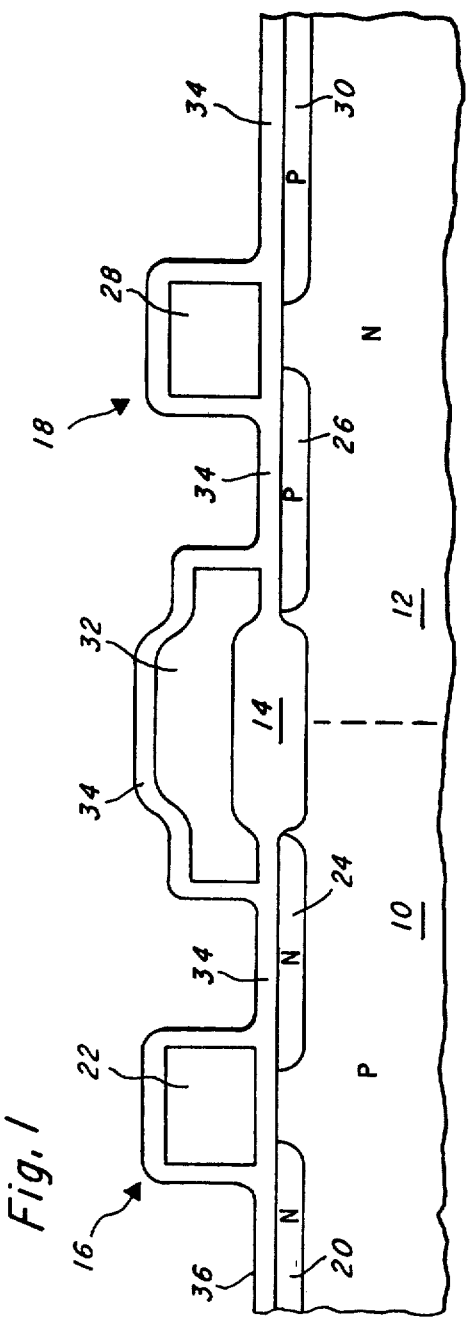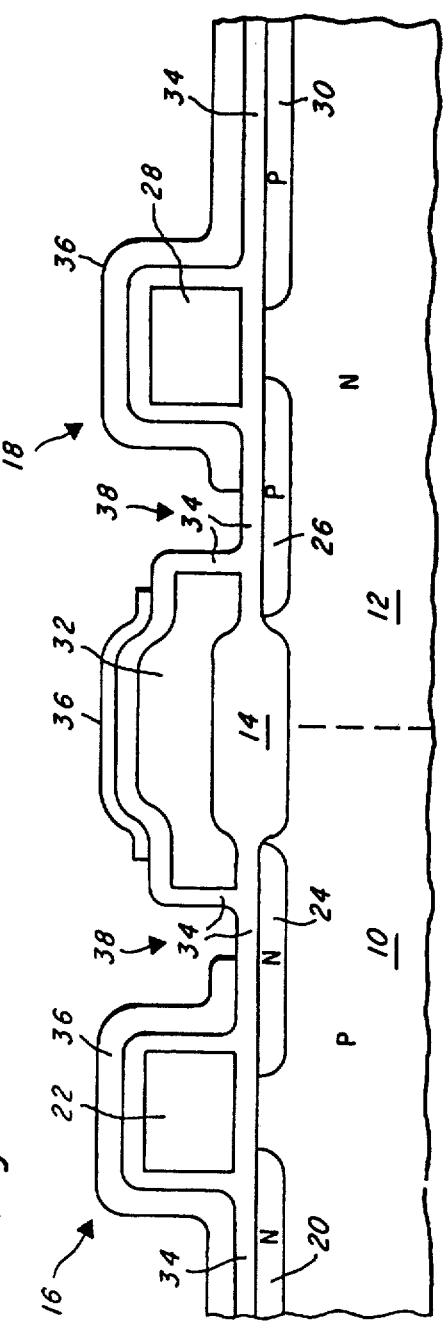

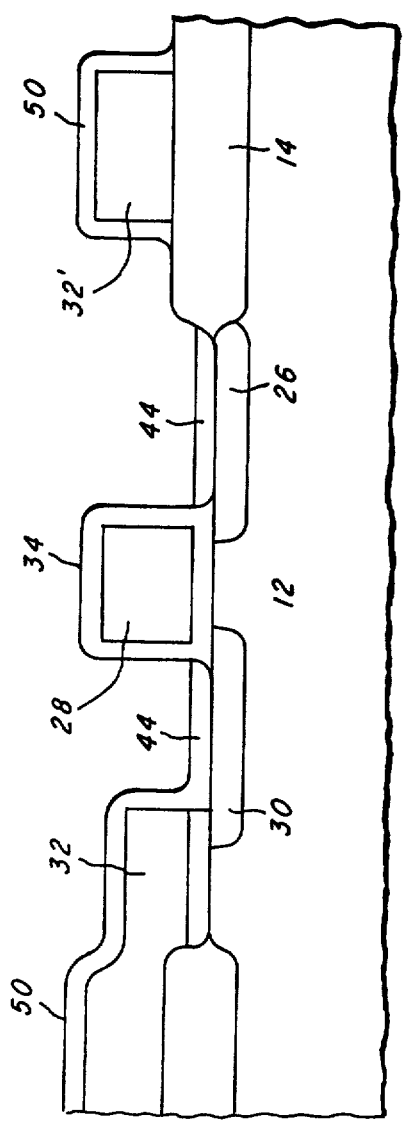
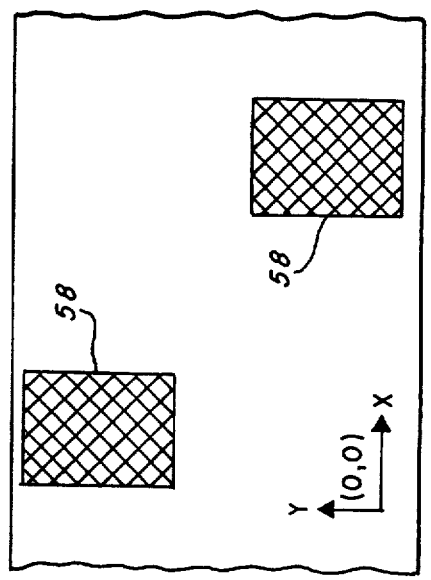
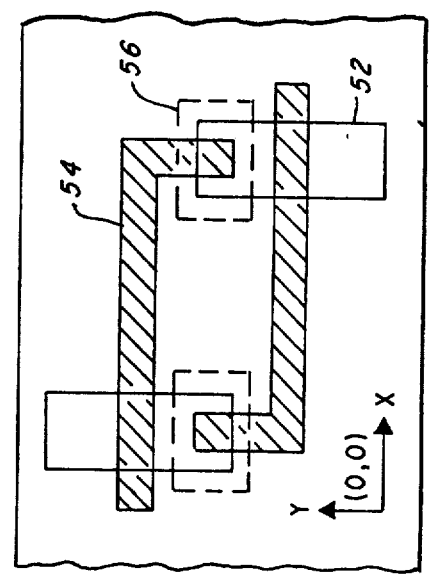

4,374,700

METHOD OF MANUFACTURING SILICIDE CONTACTS FOR CMOS DEVICES

BACKGROUND OF THE INVENTION

The present invention is directed to providing connections between polysilicon wiring and source and drain diffusions in CMOS technology.

In conventional NMOS technology, a buried contact is frequently used to provide a contact from polysilicon wiring to the source and drain diffusions. After the gate oxide has been formed, but before the polysilicon wiring is deposited, contact holes are etched in the gate oxide to selectively allow the polysilicon to be deposited directly on the silicon substrate. During the drive-in of the dopant into the polysilicon, the doping impurities in the polysilicon diffuse through the contact hole into the silicon substrate. Thus, when the conductivity type of the polysilicon wiring is the same as that of the source and drain diffusions, a self-aligned interconnect may easily be formed.

However, in a CMOS device which uses n-type polysilicon to form the gate of both p channel and n channel devices, this technique would not permit formation of a buried contact to a p+ source or drain diffusion. The n+ dopant diffusing out of the polysilicon would not form a connection to the p-type source or drain diffusion, but would form a short circuit to the n-type substrate or n-type well. This inability to form a buried contact to a p-type source or drain diffusion places a serious constraint on CMOS design, since the possibility of making direct contacts to both p-type and n-type source or drain areas would permit greatly increased efficiency of utilization of silicon real estate in CMOS design.

It is of course known, from Schottky TTL technology, to provide silicide strap connectors across p and n regions. However, in this technology Schottky barrier contacts, and not ohmic contacts, are formed to the n regions. It is also known to use platinum silicide to form ohmic source contacts, but it is believed to be novel to use silicides for ohmic contacts from poly to both p and n regions, according to the present invention.

Thus, it is an object of the present invention to provide a technology which permits direct formation of first contacts between a polysilicon gate-level interconnect and a source or drain region of either conductivity type.

It is a further object of the present invention to provide a technology which permits easy formation of ohmic contacts between polysilicon gate-level interconnects and source or drain regions of either conductivity type.

It is a further object of the present invention to provide a technology, for forming ohmic contacts to source or drain regions of either conductivity type, which is a self-aligned process.

It is a further object of the present invention to provide a technology, for forming connections between gate-level interconnects and source or drain regions of either conductivity type, which provides contacts which are as compact as those produced by a buried contact connection between an n+ doped polysilicon interconnect and an n-type source or drain region.

SUMMARY OF THE INVENTION

According to the present invention, there is provided a process for forming contacts between gate-level interconnects, comprising doped polysilicon, and either n- or p-type source or drain regions formed in a silicon substrate which is covered by a gate insulator layer, comprising the steps of: etching regions of the gate insulator layer where the contacts are to be formed, the etching step also partially undercutting the gate-level interconnects by eroding the gate insulator beneath the gate-level interconnects at the edges thereof where the contacts are to be formed; conformally depositing undoped polysilicon on the resulting composite surface; etching the undoped polysilicon, so as to remove the undoped polysilicon from all areas where the gate-level interconnects are undercut by the first-mentioned etching step; and siliciding exposed areas of the silicon substrate, the gate-level interconnects, and the conformally deposited undoped polysilicon layer, whereby silicide contacts are formed between the gate-level interconnects and the respective exposed regions of the substrate.

Thus, according to the present invention, first contacts are easily formed to connect source or drain regions to polysilicon gate-level interconnects, regardless of the conductivity type of the source or drain regions involved. Moreover, since the silicide first contacts are formed directly from the exposed regions of silicon, the contacts thus provided are self-aligned. Thus, compact connections between gate-level interconnects and CMOS circuit elements are easily formed, so that very compact circuit design can be easily attained in CMOS technology. In addition, the contacts thus formed are ohmic, so that unwanted junction or Schottky barrier effects are easily avoided.

In addition, by undercutting the gate-level polysilicon interconnect, and conformally depositing a small amount of polysilicon to fill the undercut region, continuity of the silicide connection grown between the gate-level interconnect and the exposed silicon of the source or drain region is assured.

Moreover, since the siliciding step according to the present invention may be performed at a very late stage of IC fabrication, temperature constraints required by silicide processes and materials may be easily satisfied, by performing the siliciding step after earlier high temperature steps.

BRIEF DESCRIPTION OF THE DRAWINGS

The present invention will now be described with reference to the accompanying drawings, wherein:

FIG. 1 is a sectional view of a partially formed CMOS device, to which the process of the present invention is to be applied to form first contacts;

FIG. 2 is a sectional view of the device of FIG. 1, to which a photoresist layer has been applied to mask the areas for silicide contacts are to be formed by the process of the present invention;

FIG. 7 is a sectional view of an application of a still further embodiment of the present invention, wherein the gate-level interconnects are augmented with a parallel layer of silicide wiring, simultaneously with the formation of first contacts according to the present invention; and FIGS. 8a and 8b show steps in the algorithmic generation of a masking reticle, which is used in applying the presently preferred best mode of the present invention.

DESCRIPTION OF THE PREFERRED EMBODIMENTS

Figure 3:
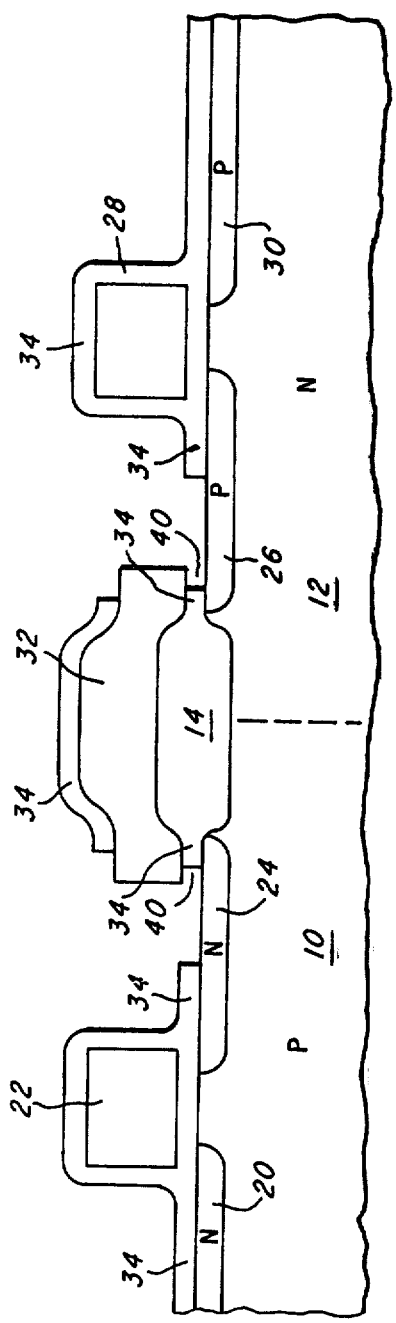
FIG. 3 is a sectional view of the same device, wherein contact holes have been etched through the gate oxide layer to expose the silicon substrate and the polysilicon gate-level interconnect, and to undercut the gate-level interconnect.

FIG. 1 shows a portion of a partially formed CMOS device to which the process of the present invention is to be applied. For compact presentation, the horizontal dimensions are not drawn to scale. A p-type region 10 is separated from an n-type region 12 by a thick field region 14. The n-type region 12 may, for example, be an n well. Alternatively, interconnects according to the present invention could be formed where the p-type region 10 is a p well, since the present invention is equally applicable to n well or p well CMOS technology. One n channel transistor 16 is shown within the p region 10, and one p channel transistor 18 is shown within the n region 12. The n channel transistor 16 includes a source 20, a gate 22, and a drain 24. The p channel transistor 18 includes a drain 26, a gate 28, and a source 30. The gates 22 and 28 are formed of polysilicon, and a gate-level interconnect 32 is also formed of polysilicon at the same time as the gates. An oxide layer 34 is provided to insulate the gates 22 and 28, and the gate-level interconnect 32.

Thus, at the stage shown in FIG. 1, the gates and gate-level interconnects (such as 22, 28 and 32) have been patterned, the sidewall oxide 34 has been grown, and the source and drain regions (such as 20, 24, 26, and 30) have been implanted and annealed, before the next step of the process of the present invention is to be applied.

FIG. 2 shows the next step in preparation of first contacts according to the present invention. As an example, assume that the particular CMOS circuit which is to be manufactured by the process of the present invention requires connection of the gate-level interconnect 32 to the n-type drain region 24 and the p-type drain region 26. A photoresist layer 36 is applied selectively, providing exposed regions 38 where first contacts are to be formed between the gate-level interconnect 32 and the drain 24 and drain 26 respectively.

A wet etch is now used to etch away the oxide 34 in the regions 38 uncovered by photoresist 36, i.e. from the sidewalls of the gate level interconnect 32 and from above portions of the regions 24 and 26. This wet etch also undercuts the gate level interconnect 32, so that the resulting pattern, after the etch and after the photoresist is removed, is as shown in FIG. 3. In applying the wet etch, care must be taken that the depth of the undercut region 40 does not exceed the distance of sideways diffusion of the p+ doped region 26 beneath the gate level interconnect 32. In the present embodiment, where it is assumed that the polysilicon of the gate level interconnect 32 is n type doped, this restriction does not apply to the undercut region 40 above the n-type drain diffusion 24, since the doping type of region 24 is the same as that of the gate.

If the undercut regions 40 formed by the wet etch, as described above, extend beyond the lateral diffusion of the p-type region 26 beneath the gate-level interconnect 32, a second implant of p-type impurities is applied. The hazard to be avoided here is that, where it is desired to form a ohmic silicide contact to a p-type region, the formation of ohmic contact to the n-type substrate 12 must be avoided, since such a contact would short circuit the device. The second implant would lower the conductivity of the n+ regions, e.g. 20 and 24, but recent experiments have indicated that this lowered conductivity could be tolerated.

Figure 4:
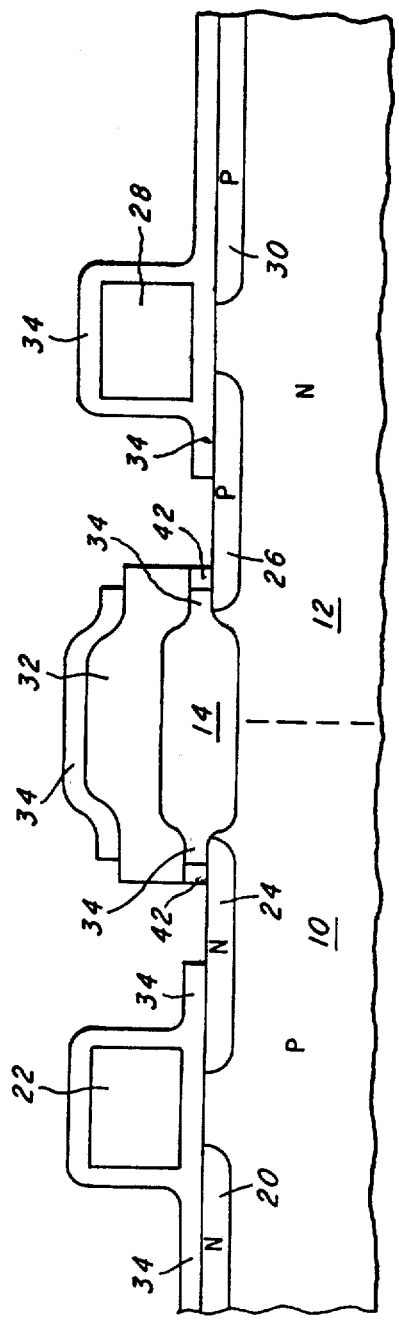
FIG. 4 is a sectional view of the same device, wherein a thin layer of polysilicon has been conformally deposited and anisotropically etched to fill in the undercut areas.

Next, as shown in FIG. 4, a thin layer 42 of high resistivity polysilicon is conformally deposited. This layer 42 must be at least half the thickness of the gate oxide 34. Thus a typical value for the thickness of the polysilicon layer 42 would be from 200 to 500 Angstroms of polysilicon. Polysilicon layer 42 is anisotropically etched, to leave a remnant of polysilicon layer 42 filling the undercut region 40 beneath the gate-level interconnect 32, as shown in FIG. 4. Thus, after this processing step, a continuous layer of polysilicon or silicon exists between the respective drain regions 24 and 26 and the gate-level interconnect 32. If siliciding of other regions on the device is desired, the oxide in those other desired regions can be appropriately etched, so that exposed silicon is left on all areas to be silicided.

Figure 5:
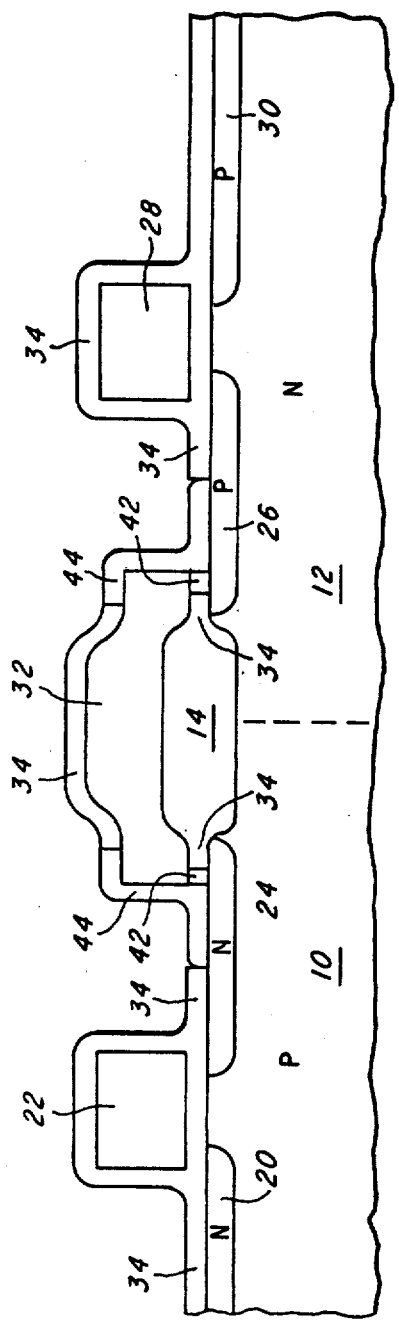
FIG. 5 is a sectional view of the same device, wherein silicide layers 44 have been grown atop the exposed regions of silicon.

An appropriate metal can be deposited on the exposed silicon areas, and reacted to form silicide. In the presently preferred embodiment, platinum or titanium is used, but any metal which will form a silicide having a low sheet resistance may be used. The resulting structure is as shown in FIG. 5. Note that a continuous layer of silicide 44 has been formed, which connects the gate level interconnect 32 to the n and p type regions 24 and 26.

The step of producing the undercut region 40, described above, ensures that the silicide layer 44 is continuous. If process parameters permit reliable production of a continuous and unbroken silicide layer 44 across the thickness of the gate oxide 34, without inserting the polysilicon layer 42, then the additional step of preparing the undercut regions 40 and conformally applying the polysilicon layer 42 could be omitted.

Figure 6:
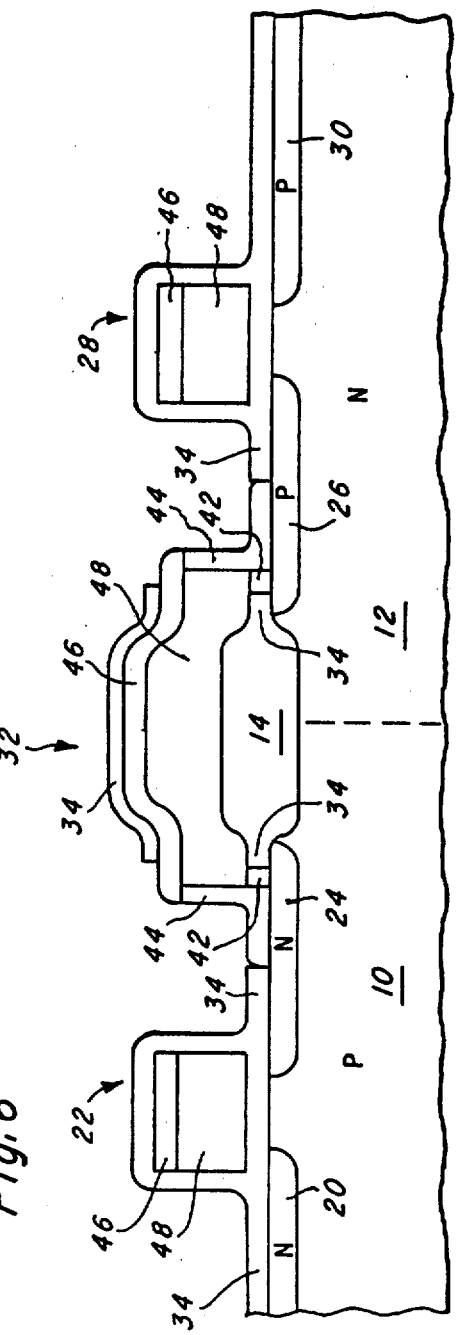
FIG. 6 is a sectional view of an application of a further embodiment of the present invention, wherein the gates and gate-level interconnects are comprised of a polysilicon and silicide layered structure.

Further modifications of the above-described preferred embodiment are also possible. For example, instead of forming the gates and gate-level interconnects entirely of polysilicon, it would also be possible to form them of a layered structure comprising a layer 46 of silicide atop a layer 48 of polysilicon, as shown in FIG. 6.

It is also possible to combine the formation of first contacts according to the present invention with simultaneous formation of a silicide-over-polysilicon wiring structure, since the method of the present invention is easily adapted to provide a method for siliciding polysilicon gate-level interconnects outside of the regions where active devices are found. As discussed above, the oxide on the sidewalls of the gate-level interconnects is normally somewhat thinner than the oxide on top of them. This is normally due to the oxide layer which was grown before the gate-level polysilicon structures were formed. However, by further etching after the structure of FIG. 3 has been formed, or by reducing the thickness of the oxide initially grown over the polysilicon, oxide could be cleared from the top as well as from the sidewalls of the gate-level interconnects. Thus, all polysilicon gate-level interconnects, outside of the regions where active devices exist, are formed to include a further layer of silicide in parallel with the polysilicon conductors, so that conductivity is improved without affecting the integrity of the active devices. Normally, such siliciding of polysilicon wiring requires an additional masking step. However, when such a structure is formed within the context of the present invention, no additional process steps are required. Merely by changing the structure of the photoresist masking layer 36 from that shown in FIG. 2, so that the tops of the gate-level interconnects are not masked, the desired silicide-strapped wiring structure is achieved.

In practice, further economies may be realized by implementing the generation of the appropriate masks algorithmically. FIG. 8a shows an example of the drawn images for a portion of a CMOS device. The drawn image 52 indicates the moat regions where active devices are to be formed, the drawn image 54 indicates the polysilicon gate-level structures, and the drawn image 56 indicates the regions where first contacts are to be formed. From these drawn images, the masking reticle which is to be used to form the first contacts may be easily formed. As shown in FIG. 8b, which exactly corresponds to FIG. 8a, a first contact reticle 58 has been algorithmically regenerated by a simple logical operation on the drawn images. First, the moat drawn image is slightly expanded horizontally. Second, the first contact reticle is algorithmically generated, by exposing all regions which are either: within the drawn first contact image 56, or outside the expanded moat region.

In FIG. 7, the silicide structure 50 indicates the additional silicide wiring layer which is achieved by this embodiment of the present invention.

Alternatively, if the process parameters and the thermal sensitivity of silicides do not permit silicide to be used for wiring, first contacts according to the present invention are formed at a very late stage of device formation, after all high-temperature stages have been completed.

Alternatively, a relatively thick layer of metallic tungsten is deposited, and only partially reacted to form tungsten silicide. Thus, the advantages of ohmic contact formation and self-aligned contacts by siliciding, as disclosed above, are obtained, and the high conductivity of metallic tungsten, which shunts the silicide wiring thus formed, is also used to advantage.

It should be noted that, since the silicide layer 44 together with the gate-level interconnect 32 straps across p- and n-type regions, no pn diode is formed, since all contacts are ohmic and no junction contacts are created.

It will be obvious to those skilled in the art that further modifications and variations of the present invention may be instituted without destroying the scope of the inventive concepts contained therein.

What is claimed is:

1. A process for forming contacts between gate-level interconnects, comprising doped polysilicon, and either n or p-type source or drain regions formed in a silicon substrate which is covered by a gate insulator layer, said process comprising the steps of:
    etching regions of said gate insulator layer where said contacts are to be formed, said etching step also partially undercutting said gate-level interconnects by eroding said gate insulator beneath said gate-level interconnects at the edges thereof where said contacts are to be formed;
    conformally depositing undoped polysilicon on the resulting composite surface;
    etching said undoped polysilicon, so as to remove said undoped polysilicon from all areas except those areas where said gate-level interconnects are undercut by said first-mentioned etching step; and
    siliciding exposed areas of said silicon substrate, said gate-level interconnects, and said conformally deposited undoped polysilicon layer, whereby silicide contacts are formed between said gate-level interconnects and said respective exposed regions of said substrate.

2. The process of claim 1, wherein said first-mentioned etching step comprises wet etching.

3. The process of claim 1, wherein said second-mentioned etching step comprises anisotropic etching.

4. The process of claim 1, 2, or 3 wherein said siliciding step comprises:
    depositing a metal overall;
    applying heat, so that said metal reacts with said regions exposed by said first-mentioned etching step; and
    etching away all unreacted portions of said metal.

5. The process of claim 4, wherein said metal is selected from the group consisting of platinum and titanium.

6. The process of claim 5, wherein said metal is titanium.

7. The process of claim 1, wherein said siliciding step comprises:
    selectively depositing tungsten above said exposed areas of said silicon substrate, said gate-level interconnect, and said conformally deposited undoped polysilicon layer; and
    applying heat, so that silicide is formed between said selectedly applied tungsten and said exposed areas.

8. The process of claim 1, 2, or 3, wherein said first-mentioned etching step also etches the upper surfaces of said gate-level interconnects.

9. A process for forming contacts between gate-level polysilicon and a silicon substrate, comprising the steps of:
    providing a silicon substrate;
    providing an insulator layer on said substrate, said insulator layer comprising gate insulator areas, wherein the thickness of said insulator layer is less than 100 nm;
    providing polysilicon on selected portions of said insulator layer;
    etching regions of said gate insulator areas, adjacent to respective portions of said polysilicon, where said contacts are to be formed, said etching step also partially undercutting said portions of said polysilicon where said contacts are to be formed by eroding said insulator layer from beneath the perimeter of said polysilicon;
    conformally depositing undoped polysilicon overall;
    anisotropically etching said undoped polysilicon, so as to remove said undoped polysilicon except from said undercuts in said gate insulator layer; and
    providing metal silicide on exposed areas of said substrate, said gate-level polysilicon, and said undoped polysilicon in said undercuts in said gate insulator areas, whereby silicide contacts are formed between said gate-level polysilicon and said respective exposed regions of said substrate.

10. The process of claim 9, wherein said step of providing silicide comprises:
depositing a metal overall;
applying heat, so that said metal reacts with said regions exposed by said first-mentioned etching step; and
etching away all unreacted portions of said metal.

* * * * *